US011211223B1

(12) United States Patent
Lazić et al.

(10) Patent No.: US 11,211,223 B1
(45) Date of Patent: Dec. 28, 2021

(54) SYSTEM AND METHOD FOR SIMULTANEOUS PHASE CONTRAST IMAGING AND ELECTRON ENERGY-LOSS SPECTROSCOPY

(71) Applicant: FEI Company, Hillsboro, OR (US)

(72) Inventors: Ivan Lazić, Eindhoven (NL); Stefano Vespucci, Eindhoven (NL); Eric Gerardus Bosch, Eindhoven (NL); Bert Henning Freitag, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/002,499

(22) Filed: Aug. 25, 2020

(51) Int. Cl.
*H01J 37/244* (2006.01)
*H01J 37/28* (2006.01)
*H01J 37/145* (2006.01)
*H01J 37/20* (2006.01)

(52) U.S. Cl.
CPC .......... *H01J 37/244* (2013.01); *H01J 37/145* (2013.01); *H01J 37/20* (2013.01); *H01J 37/28* (2013.01); *H01J 2237/24455* (2013.01); *H01J 2237/24485* (2013.01)

(58) Field of Classification Search
CPC ........ H01J 37/244; H01J 37/20; H01J 37/145; H01J 37/28; H01J 2237/24485; H01J 2237/24455
See application file for complete search history.

(56) References Cited

U.S. PATENT DOCUMENTS

| 8,912,509 B2* | 12/2014 | Kociak | H01J 37/244 250/458.1 |
| 9,228,962 B2* | 1/2016 | Kociak | H01J 37/261 |
| 10,224,174 B1* | 3/2019 | Freitag | H01J 37/147 |
| 10,607,811 B1* | 3/2020 | Mohammadi-Gheidari | H01J 37/09 |
| 2003/0085350 A1* | 5/2003 | Kaji | G01N 23/04 250/305 |
| 2003/0085356 A1* | 5/2003 | Kaji | H01J 37/28 250/311 |
| 2013/0015351 A1* | 1/2013 | Kooijman | H01J 37/28 250/307 |

(Continued)

OTHER PUBLICATIONS

I. Lazić, E.G.T. Bosch and S. Lazar, Phase contrast STEM for thin samples: Integrated differential phase contrast, Ultramicroscopy, 2016, pp. 265-280, vol. 160, Elsevier B.V.

(Continued)

*Primary Examiner* — David A Vanore

(57) ABSTRACT

A method for imaging a sample with charged particles comprises directing charged particles towards the sample along a primary axis, and simultaneously detecting a first portion and a second portion of the charged particles transmitted through the sample with a first detector and a second detector, respectively. The second detector is positioned downstream of the first detector. Each of the transmitted charged particles exits the sample at an exit angle between a direction of the transmitted charged particle and the primary axis. The exit angles of the first portion of the transmitted charged particles overlap with the exit angles of the second portion of the transmitted charged particles. In this way, complimentary information, such as the structural and compositional information, may be obtained simultaneously.

20 Claims, 8 Drawing Sheets

(56) References Cited

U.S. PATENT DOCUMENTS

| | | | |
|---|---|---|---|
| 2013/0062520 A1* | 3/2013 | Henstra | H01J 37/26 |
| | | | 250/311 |
| 2013/0087706 A1* | 4/2013 | Kociak | H01J 37/023 |
| | | | 250/310 |
| 2015/0243474 A1* | 8/2015 | Lazic | H01J 37/244 |
| | | | 250/307 |
| 2016/0056015 A1* | 2/2016 | van Veen | H01L 27/1461 |
| | | | 250/440.11 |
| 2020/0090899 A1* | 3/2020 | Mohammadi-Gheidari | |
| | | | H01J 37/10 |

OTHER PUBLICATIONS

I. Lazić and E.G.T. Bosch, Chapter 3—Analytical Review of Direct Stem Imaging Techniques for Thin Samples, Advances in Imaging and Electron Physics, Peter W. Hawkes, editor, 2017, pp. 75-184, vol. 199, Burlington, Academic Press.

E. Yücelen, I. Lazić & E.G.T. Bosch, Phase contrast scanning transmission electron microscopy imaging of light and heavy atoms at the limit of contrast and resolution, Scientific Reports 8,2018, Article 2676.

\* cited by examiner

SYSTEM AND METHOD FOR SIMULTANEOUS PHASE CONTRAST IMAGING AND ELECTRON ENERGY-LOSS SPECTROSCOPY

INCORPORATION BY REFERENCE

All publications, patents, and patent applications mentioned in this specification are herein incorporated by reference to the same extent as if each individual publication, patent, or patent application was specifically and individually indicated to be incorporated by reference.

FIELD OF THE INVENTION

The present description relates generally to methods and systems for imaging a sample using a charged particle system, and more particularly, to simultaneously performing phase contrast imaging and energy loss spectroscopy on the sample using the charged particle system.

BACKGROUND OF THE INVENTION

Electron energy loss spectroscopy (EELS) may reveal the compositional information by measuring the energy loss of electrons passing through a thin sample. In EELS, electrons transmitted through the sample are spatially dispersed by a spectrometer based on the electron energy and collected as a spectrum by a detector downstream of the spectrometer. EELS may be performed simultaneously with dark-field transmission electron microscopy (TEM). The TEM signal can be acquired with a high-angle annular dark-field (HAADF) detector positioned between the sample and the spectrometer. By scanning a focused electron beam over the sample, a scanning transmission electron microscopy (STEM) image showing sample structure and an EELS dataset containing the chemical information of each scan location can be obtained within a single scan. Simultaneously acquiring the STEM and EELS signals guarantees that the acquired structural and compositional information are spatially registered. However, under certain conditions, STEM image acquired with the HAADF detector cannot show all sample structure. For example, HAADF image does not have sufficient signal to noise ratio to show light atoms when both light and heavy atoms are present in the sample.

EELS cannot be performed using its full capacity simultaneously with other types of TEM or STEM based imaging techniques because electrons with high scattering angle are blocked by detectors positioned upstream of the spectrometer. For example, differential phase contrast (DPC) STEM imaging and integrated differential phase contrast (iDPC) STEM imaging are capable of reaching sub-Å resolution. The DPC-STEM records two-dimensional spatial wave amplitude distribution in the image plane using, for example, a segmented detector positioned downstream of the sample. The iDPC-STEM imaging is introduced by I. Lazić and E.G.T. Bosch in Ultramicroscopy 160 (2016) 265-280; I. Lazić and E.G.T. Bosch in Advances in Imaging and Electron Physics 199 (2017) 75-184; and E. Yücelen, I. Lazić and E.G.T. Bosch in Scientific Reports 8, 2676 (2018). The iDPC-STEM imaging is also disclosed in U.S. patent application Ser. No. 14/629,387 by Lazic et al, filed on Feb. 23, 2015. The above publications and patent application are incorporated by reference herein. The iDPC-STEM image is generated by integrating a DPC-STEM vector image acquired by segmented (DPC/iDPC) detector or camera. The iDPC-STEM is capable of imaging both light and heavy atoms in the sample. With existing/current detector configurations, neither DPC-STEM nor iDPC-STEM can be performed together with EELS because the segmented DPC/iDPC detector blocks electrons that are required for detecting and interpreting the EELS dataset. The same issue also occurs in differentiated differential phase contrast (dDPC) STEM which is obtained by differentiating (applying divergence operator to) a DPC-STEM vector image. The current invention presents methods and systems allowing the above described simultaneous acquisition of EELS and TEM/STEM based images.

SUMMARY

In one embodiment, a method for imaging a sample with charged particles comprises: directing charged particles towards the sample along a primary axis; and simultaneously detecting a first portion and a second portion of the charged particles transmitted through the sample respectively with a first detector centered at the primary axis and a second detector downstream of the first detector, wherein each of the transmitted charged particles exits the sample at an exit angle between the direction of the transmitted charged particle at the sample backside and the primary axis, and the exit angles of the first portion of the transmitted charged particles overlap with the exit angles of the second portion of the transmitted charged particles. In this way, the structural and compositional information of the sample can be acquired simultaneously using the first detector and the second detector. The structural information may be shown in a sample image, and the compositional information may be shown in the form of spectra. High-scattering-angle electrons may reach the second detector without significantly sacrificing quality of the phase contrast image. In some embodiments, the transmitted charged particle beam may be rotated relative to the first detector at a location upstream of the first detector. The spectra acquired before and after the beam rotation can be combined to generate a combined spectrum covering the 360 degrees of azimuthal angle of transmitted charged particles at the sample backside.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the drawings.

DETAILED DESCRIPTION OF EMBODIMENTS

Figure 1:
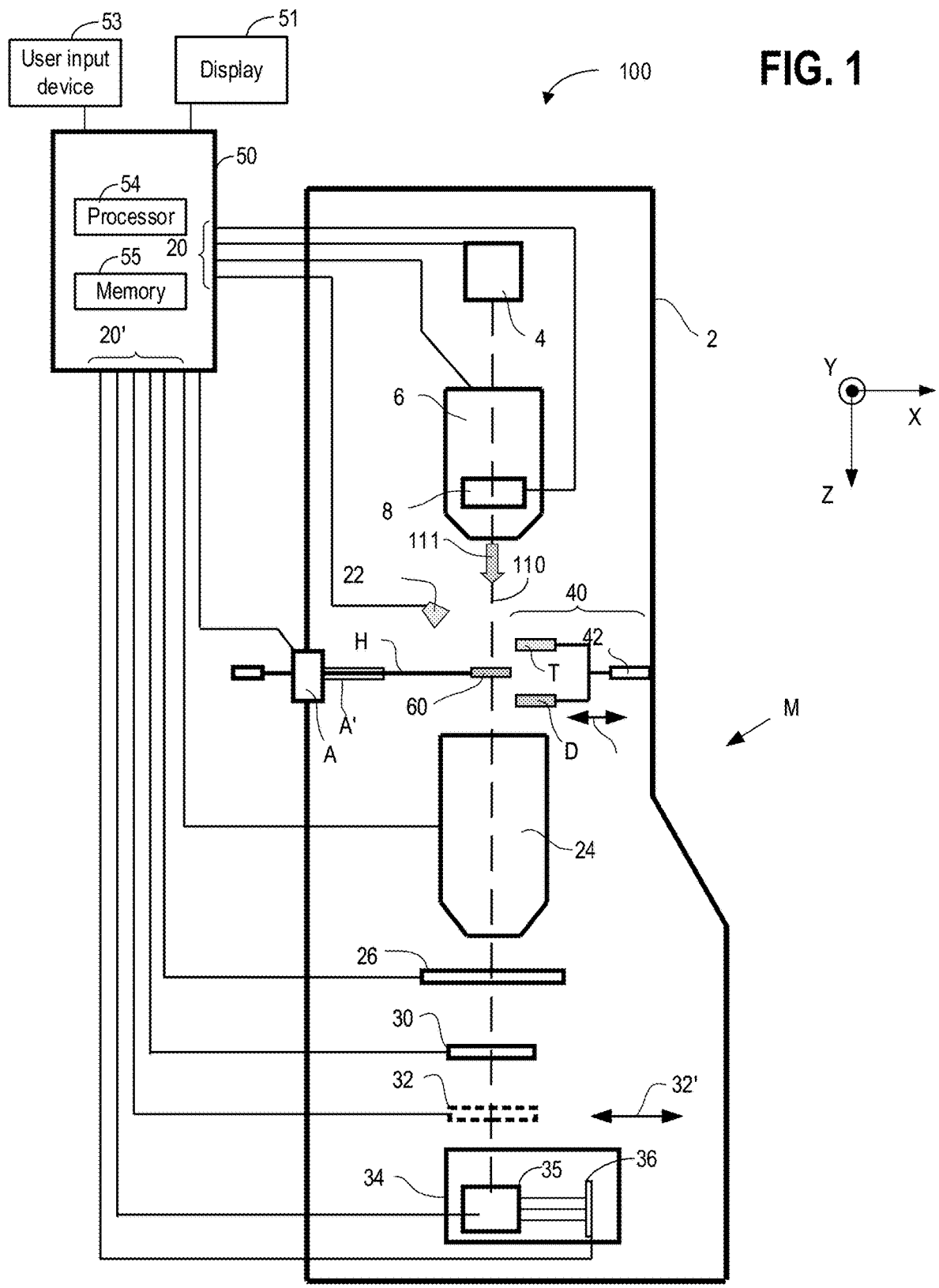
FIG. 1 illustrates a charged particle microscope for combined phase contrast imaging and electron energy loss spectroscopy (EELS), according to some embodiments.
Figure 2:
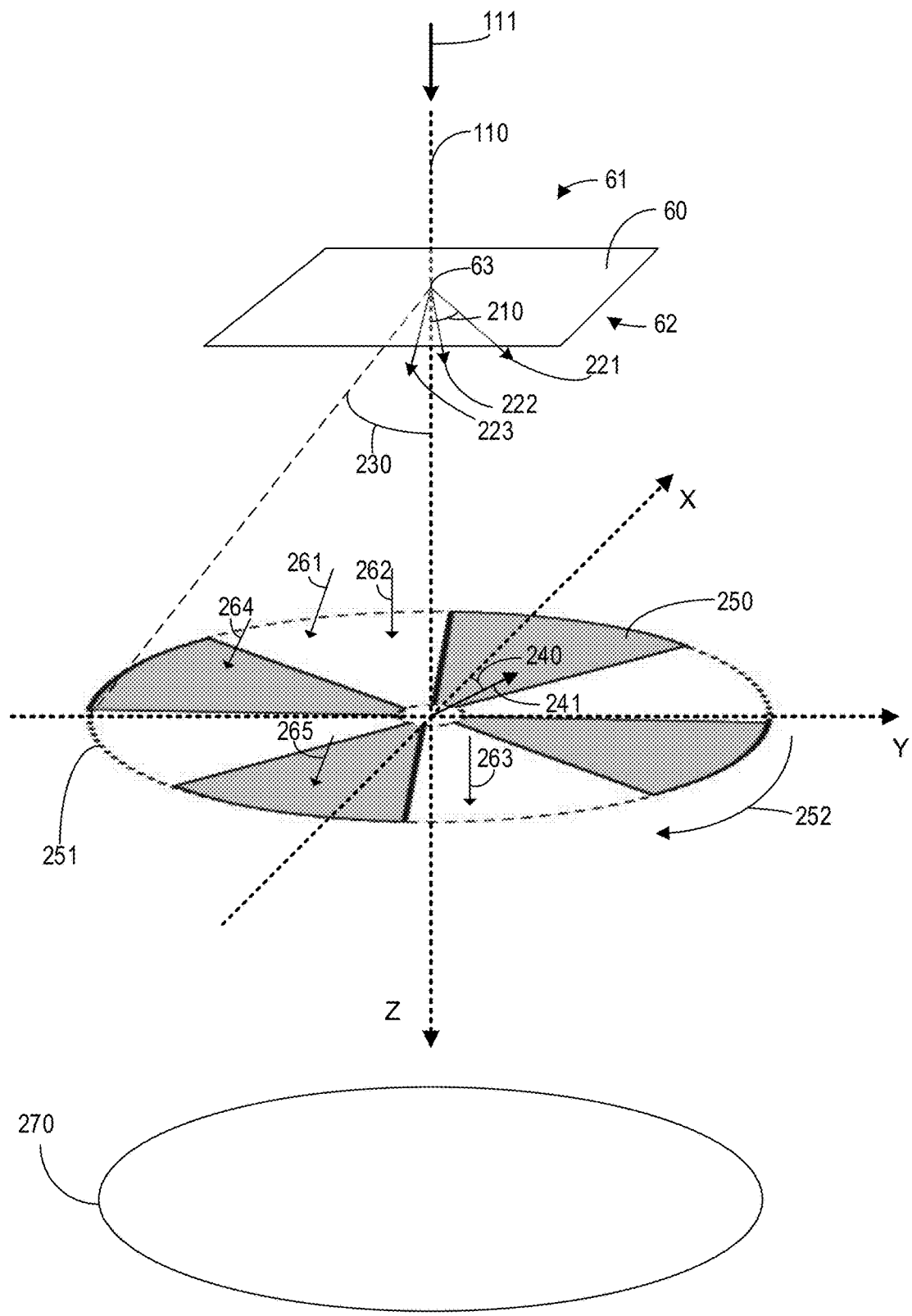
FIG. 2 shows position of the detector for imaging sample structure relative to the charged particle beam.

The following description relates to systems and methods for simultaneously acquiring the structural and composition/bonding information of a sample using a charged particle imaging system, such as the charged particle imaging system shown in FIG. 1. The structural information may be obtained through phase contrast imaging, such as differential phase contrast (DPC) scanning transmission electron microscopy (STEM) imaging or integrated differential phase contrast (iDPC) STEM imaging, via a first detector positioned downstream of the sample. The composition, bonding or electronic structure information may be obtained through electron energy loss spectroscopy (EELS) via a second detector positioned downstream of the first detector. A spectrometer is positioned between the first detector and the second detector to spatially disperse the charged particles based on particle energy. The first detector is centered at the primary axis of the charged particle beam. Responsive to irradiation of the charged particle beam on the frontside of the sample, some of the scattered charged particles are transmitted through the sample and emitted from the sample backside. The direction of each transmitted charged particle at the sample backside is defined by an exit angle and an azimuthal angle, as shown in FIG. 2. The exit angle is the angle between the direction of the transmitted charged particle and the primary axis. The azimuthal angle is in a plane perpendicular to the primary axis. In one example, the primary axis aligns with the z-axis. The azimuthal angle is the angle between the projection of the direction of the transmitted charged particle in the x-y plane and the x-axis. The first detector and the second detector simultaneously detect a first portion and a second portion of the transmitted charged particle beam, respectively. The first detector includes one or more charged particle transparent regions that allow the second portion of the transmitted charged particles to pass through the first detector without being detected by the first detector. The second portion of the transmitted charged particles may not interact, or have negligible interaction, with the first detector. As such, the presence of the first detector does not affect the detection of the second portion of the transmitted charged particles detected by the second detector. In one example, the one or more charged particle transparent regions in the first detector may be openings. In another example, the one or more charged particle transparent regions may be a thin layer of material that does not disturb the energy distribution of the charged particles impinged upon. The exit angles of the first portion of the transmitted charged particles detected by the first detector overlap with the exit angles of the second portion of the transmitted charged particles detected by the second detector. As such, some of the transmitted charged particles received by the first and second detectors have the same exit angle, but different azimuthal angles. The maximum exit angle of transmitted charged particles detected by the second detector may be the same as the transmitted charged particles detected by the first detector, so that both the first and second detectors can detect the full range of the angular momentum of the transmitted charged particles.

In one example, the first detector detects the first portion of transmitted charged particles with exit angles in a first range [A1 A2], wherein A1 is the lowest exit angle detected and A2 is the largest exit angle detected, and wherein A1≥0 degree and A2<90 degrees. The second detector detects the second portion of transmitted charged particles with exit angles in a second range [A3 A4], wherein A3 is the lowest exit angle detected and A4 is the largest exit angle detected, and wherein 0≤A3≤A2 and A4<90 degrees. The first range and the second range overlap with each other. The overlapped range may be [A1 A4] or [A1 A2]. In one example, the maximum exit angles detected by the first and second detectors are the same. That is, A2=A4. In another example, A4>½A2, so that the second detector is sensitive to high-scattering-angle electrons. The first and the second detectors may be capable of detecting any exit angle within the first and second range, respectively. In other examples, the first or the second detector may be capable of detecting selective exit angles within their respective range.

In another example, at a particular exit angle within the overlapped range, the first and second detectors are sensitive to transmitted electrons with different azimuthal angles. The first detector may include at least one charged particle transparent region that extends less than 360 degrees in the azimuthal direction along a radius of the first detector. The region allows part of the transmitted electrons passing through the first detector. The first detector does not affect or has little effect on the electrons passing through the opening. That is, the energy and the direction of the electrons passing through the charged particle transparent region are not changed (or are with negligible change) by the first detector.

In some examples, the first detector includes multiple detection segments and at least one opening arranged between at least two of the detection segments. Signals detected by each of the detection segments may be transferred to the controller via separate amplifiers. As shown in FIGS. 4A, 5D, 6A and 6B, the first detector (such as the DPC/iDPC detector) may be in the form of a "windmill", wherein multiple detection segments of the same shape are evenly spread circularly in the azimuthal direction relative to the primary axis. Two edges of each detection segment (or blade of the windmill) extend in the radial directions from the primary axis. The detection segments are separated by an opening from each other. For a detector with four detection segments, though the detection area of the detector is reduced comparing to the conventional four-segment DPC/iDPC detectors with connected detection segments, the quality of iDPC-STEM image acquired using the detector with disconnected detection segments is similar to the one acquired with the conventional DPC/iDPC detector, as shown in FIGS. 3A-3D and 4A-4D. This is because the contrast transfer function (CTF) of the detector with reduced detection area is similar to the conventional DPC/iDPC detector. In some examples, the first detector may include a central opening to allow transmitted charged particles with low exit angle entering the spectrometer. In other examples, the first detector may not have the central opening, as shown in FIGS. 6A-6B. The first detector and the second detector receive transmitted charged particles with azimuthal angles not overlapped with each other.

Figure 9:
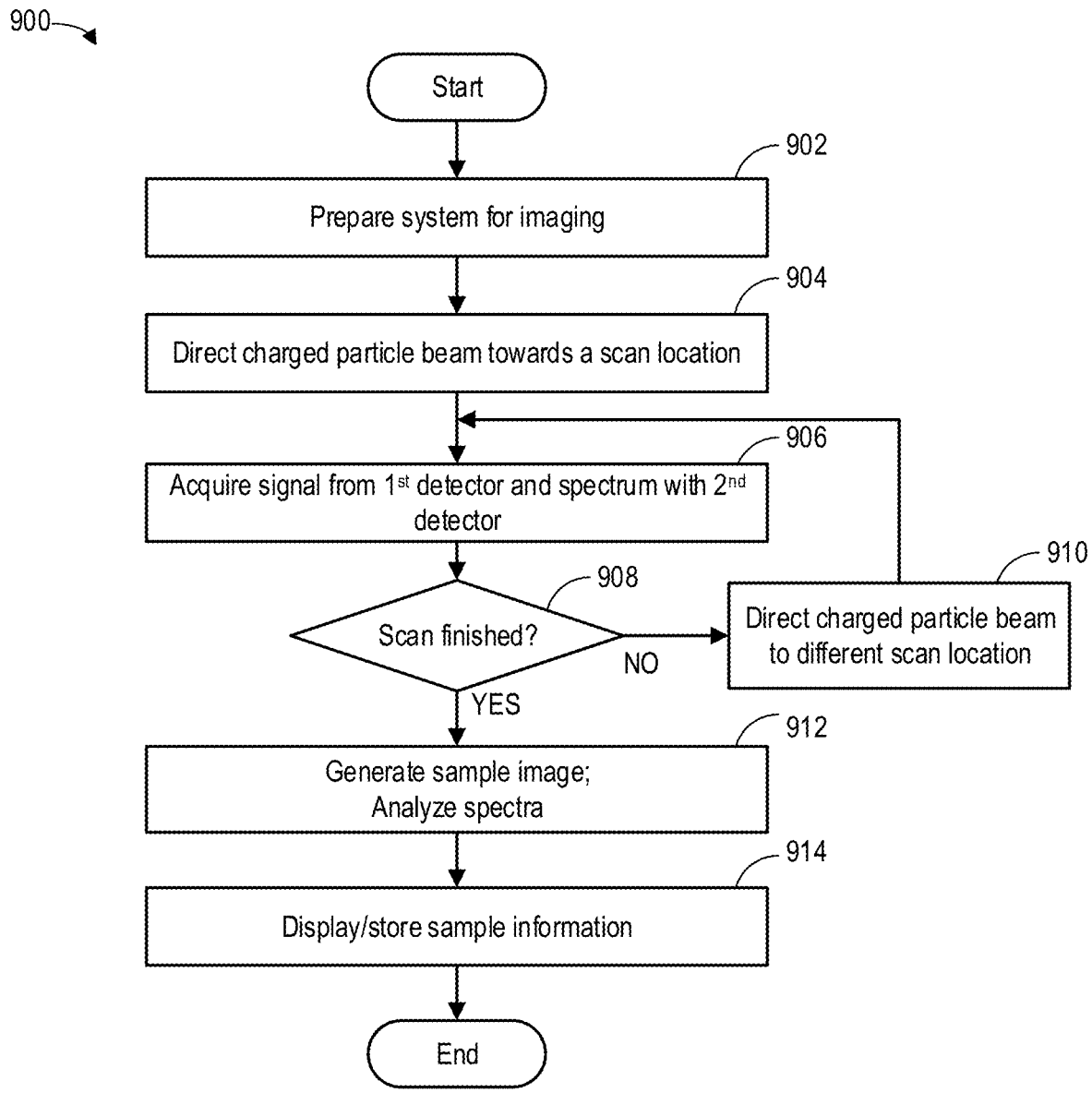
FIG. 9 shows another example method for simultaneously acquiring a sample image and EELS data using the system of FIG. 1.

As shown in FIG. 9, the sample structural image can be obtained from the first detector by scanning a focused charged particle beam over multiple scan locations. The compositional information at each scan location is extracted based on the spectrum obtained with the second detector. The first detector and the second detector are sensitive to high-scattering-angle charged particles with different azimuthal angles.

Figure 7:
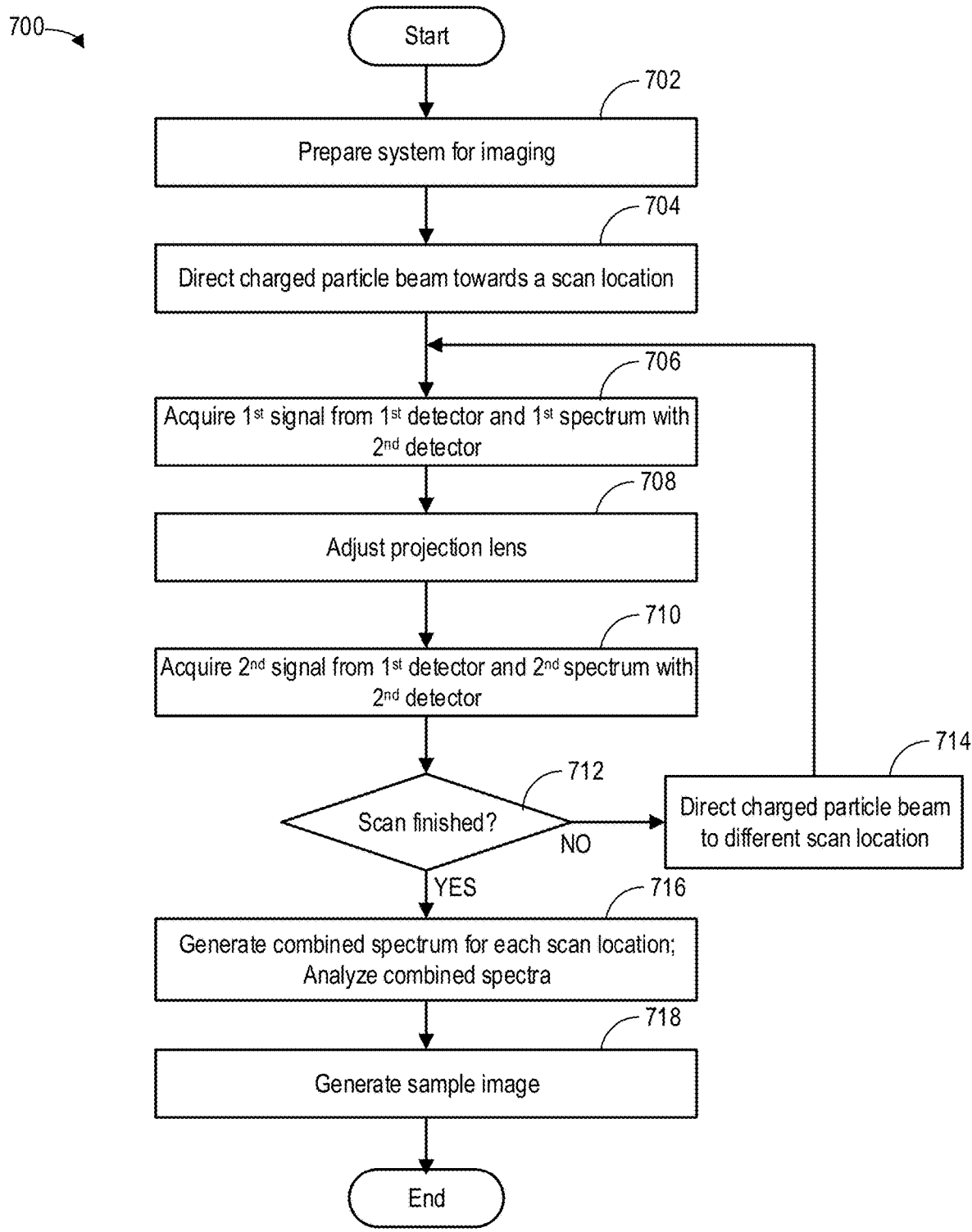
FIG. 7 shows an example method for simultaneously acquiring a sample image and EELS data using the system of FIG. 1.
Figure 8:
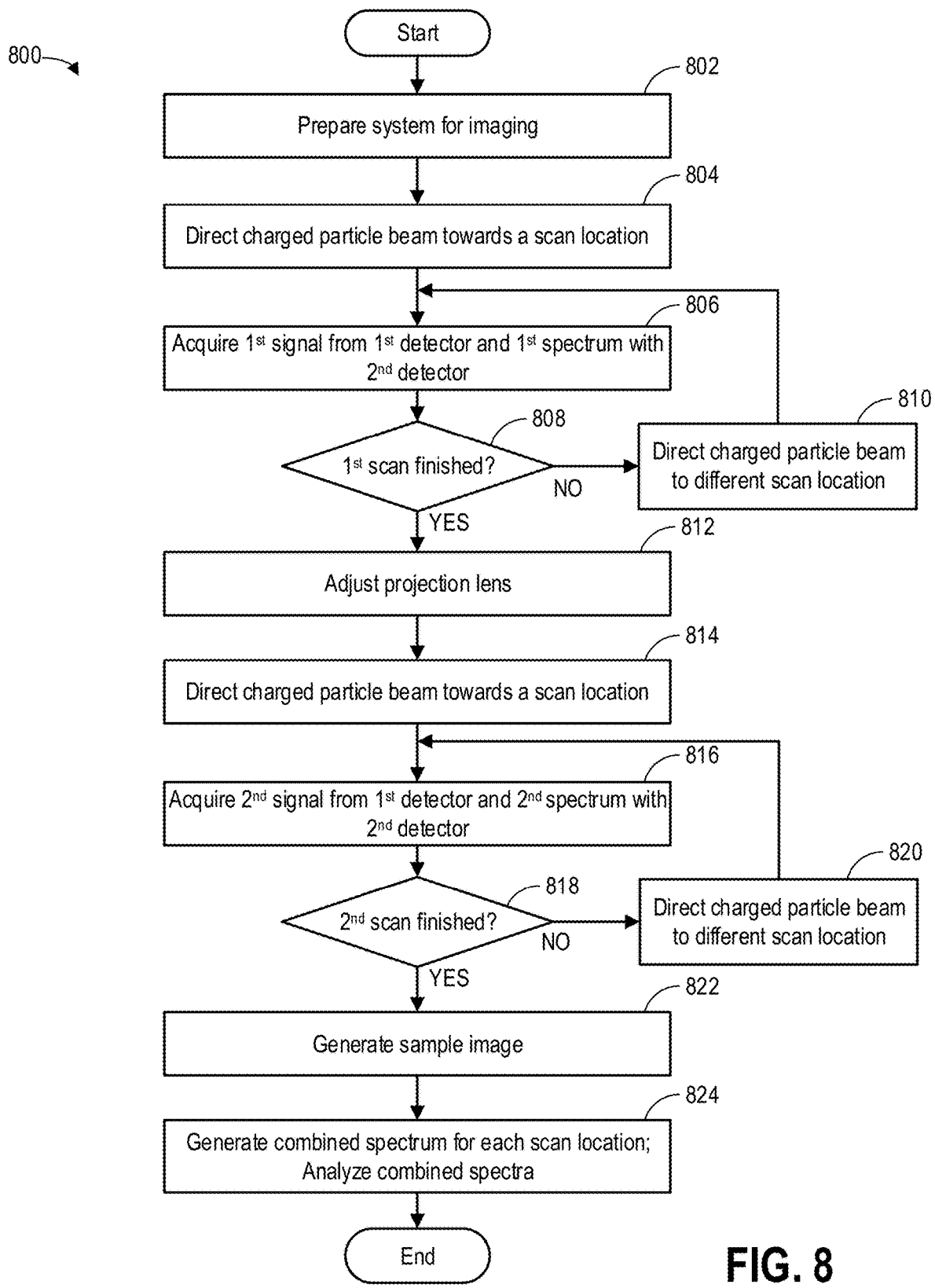
FIG. 8 shows another example method for simultaneously acquiring a sample image and EELS data using the system of FIG. 1.

In some embodiments, the transmitted charged particle beam is rotated relative to the first detector azimuthally around the primary axis, so that transmitted charged particles covering the full 360 degrees of the azimuthal angle and a large range of exit angle may be acquired by each of the first detector and the second detector. The second detector may capture all of the transmitted charged particles with exit angles not greater than the maximum detectable exit angle of the first detector. For example, the second detector acquires a first spectrum and a second spectrum before and after rotating the transmitted charged particles relative to the first detector, respectively. The first and the second spectra are complementary to each other. That is, the first and the second spectra correspond to different portions of the transmitted charged particles at a scan location. By combining the first and second spectra, the combined spectrum contains the same information as the spectrum acquired without the first detector (that is, without blocking the electrons entering the EELS spectrometer). The transmitted charged particles may be rotated relative to the first detector by rotating any one of the sample, the first detector, or the transmitted charged particle beam between the sample and the first detector, relative to the primary axis. The transmitted charged particle beam can be rotated by adjusting the excitation of at least one lens in the projection lens arranged between the sample and the first detector, as disclosed in U.S. patent application Ser. No. 15/803,642 by Freitag et al, filed on Nov. 3, 2017, which is incorporated by reference herein. Comparing to rotating the sample or the first detector, adjusting the projection lens is faster and does not introduce sample shift. FIGS. 7-8 show two methods of generating the combined spectra. In FIG. 7, unrotated and rotated spectra at a scan location are acquired before deflecting the charged particle beam to another scan location. Alternatively, FIG. 8 shows a method of performing a first scan and acquiring a first spectrum. After rotating the transmitted charged particle beam, a second scan is performed over the same region of interest (ROI) and a second spectrum is acquired. The structural images acquired during each scan may be used for combining the first and second spectra.

Turning to FIG. 1, the figure shows a highly schematic depiction of an embodiment of a charged-particle microscope 100 in which the present invention can be implemented. More specifically, it shows an embodiment of a transmission-type microscope, which may be an electron microscope. Within a vacuum enclosure 2, an charged particle (such as electron) source 4 produces a beam 111 of electrons that propagates along a primary axis 110 and traverses an electron-optical illuminator 6, serving to direct/focus the electrons onto a chosen part of a sample 60 (which may, for example, be (locally) thinned/planarized). Also depicted is a deflector 8, which (inter alia) can be used to effect scanning motion of the beam 111.

The sample 60 is held on a sample holder H that can be positioned in multiple degrees of freedom by a positioning device/stage A, which moves a cradle A' into which holder H is (removably) affixed; for example, the sample holder H may comprise a finger that can be moved (inter alia) in the XY plane (see the depicted Cartesian coordinate system; typically, motion parallel to Z direction and tilt about X/Y direction will also be possible). Such movement allows different parts of the sample 60 to be illuminated/imaged/inspected by the electron beam 111 traveling along primary axis 110 in the Z direction (and/or allows scanning motion to be performed, as an alternative to beam scanning). The sample holder H may also rotate the sample relative to the primary axis 110. If desired, an optional cooling device (not depicted) can be brought into thermal contact with the specimen holder H, so as to maintain it (and the sample 60 thereupon) at cryogenic temperatures, for example.

The electron beam 111 interacts with the sample 60 in such a manner as to cause various types of "stimulated" radiation to emanate from the sample 60, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance. Electrons may transmit (pass through) the sample 60, exit/emanate from the backside of the sample, and continue to propagate (substantially, though generally with some deflection/scattering) along primary axis 110. Such a transmitted electron flux enters projection lens 24. The projection lens 24 may comprise a variety of electrostatic/magnetic lenses, deflectors, correctors (such as stigmators), etc.

Multiple detectors may be positioned downstream of the projection lens 24 for detecting and analyzing the transmitted electrons with various exit angles at the sample backside. A first detector and a second detector are used for detecting the transmitted electrons simultaneously. Responsive to irradiation, a first portion of the transmitted electrons are detected by the first detector. A second portion of the transmitted electrons pass through one or more charged particle transparent regions of the first detector and are detected by the second detector positioned downstream of the first detector. The first and second detectors may be any one of the high-angle annular dark-field (HAADF) detector 26, the DPC/iDPC detector 30, TEM/STEM detector 32, and spectroscopic apparatus 34. In one example, the first detector is the DPC/iDPC detector 30, and the second detector is the EELS detector. The DPC/iDPC detector 30 is configured to allow a part of high-scattering-angle electrons passing though, so that transmitted electrons received by DPC/iDPC detector 30 and the EELS detector 36 of the spectroscopic apparatus 34 have overlapped exit angles. Examples of the DPC/iDPC detector are shown in FIGS. 2-6. The TEM/STEM detector 32 may optionally be arranged downstream of the HAADF detector 26 and the spectroscopic apparatus 34. The TEM/STEM detector 32 may be retracted/withdrawn (as schematically indicated by arrows 32') to allow the transmitted electrons entering the spectroscopic apparatus 34, such as the electron energy loss spectroscopy (EELS) module. The spectroscopic apparatus may include a spectrometer 35 that disperse the charged particles based on the energy of the charged particle and the EELS detector 36 for sensing the spectrum formed by the dispersed charged particles. The spectrum may be the electron energy loss spectrum.

In another example, the first detector is a camera including a large amount of small segments called pixels. The camera includes one or more openings (such as transparent sets of pixels) allowing the second portion of the charged particles to pass through the camera and be detected by the second detector. Center of mass (COM)-STEM and/or integrated center of mass (iCOM)-STEM images may be acquired by the camera. In yet another example, the first detector is a positioning sensitive detector (PSD) that includes one or more openings (such as transparent sets of pixels) allowing the second portion of the charged particles to pass through the PSD and be detected by the second detector.

Responsive to scanning the charged particle beam over multiple scanning locations of the sample, signals detected from the first detector may be used to form an image showing the structure of the sample. The first image may be an iDPC-STEM image or an iCOM-STEM image. The iCOM-STEM image is an ideal version of iDPC-STEM image obtained when the detector is either a PSD or a camera consisting of relatively large amount of smaller segments (ideally, camera with pixels), so that COM or the barycenter of the illumination can be computed more accurately. The first detector image may also be any other type of STEM image, such as DPC-STEM, dDPC-STEM, COM-STEM, dCOM-STEM, BF-STEM, ABF-STEM, ADF-STEM, HAADF-STEM, single segment STEM, etc. At each scanning location, signals detected from the second detector may contain chemical or compositional information of the sample.

Controller 50 is connected to various illustrated components via control lines (buses) 20'. The controller 50 may include a processor 54 and a non-transitory memory 55 for storing computer readable instructions. By executing the computer readable instructions stored in the non-transitory memory, the controller can implement the various methods disclosed herein. Controller 50 can provide a variety of functions, such as synchronizing actions, providing setpoints, processing signals, performing calculations, receiving operator input from user input device 53 and displaying messages/information on a display device 51. For example, the controller 50 may be configured to process the signals received from the various detectors, and generate images showing the sample's structure and/or composition. The controller 50 may adjust the transmitted charged particle beam by adjusting one or more lenses in the projection lens 24. Controller 50 may be (partially) inside or outside an enclosure, and may have a unitary or composite structure, as desired.

In some embodiments, the first detector and the second detector may be used for other types of the imaging. As an example, the first detector may be used for chemical/compositional information acquisition and the second detector may be used for structural information acquisition. For example, the first detector is the EELS detector and the second detector is the DPC/iDPC detector. In another example, both the first detector and the second detector may be used for structural information or compositional information acquisition. In some examples, one or more additional detectors with charged particle transparent regions may be positioned upstream of the second detector.

Though a transmission type electron microscopy is described by way of example, it should be understood that the imaging system may be other types of charge-particle microscopy system, such as a dual beam tool such as a focused ion beam combined with scanning electron microscopy (FIB-SEM).

FIG. 2 is a zoomed-in view showing the configuration of the first detector and the second detector relative to the primary axis of the charged particle beam. As an example, the first detector 250 may be a DPC/iDPC detector. The first detector may include four disconnected detection segments arranged around the primary axis 110 in the azimuthal direction 252. Electron beam 111 irradiates sample frontside 61 of sample 60 along the Z direction, and impact location 63 on sample 60. The electron beam 111 may be a focused beam. Electrons transmitted through sample 60 exit the sample backside 62 with different directions (such as directions 221, 222, and 223). The direction of the transmitted charged particle exiting the sample backside is defined by an exit angle and an azimuthal angle. The exit angle of the transmitted electron is the angle between the electron direction and the primary axis. For example, for transmitted electron with direction 221, the exit angle is angle 210. The exit angle ranges from zero to 90 degrees. Large exit angle corresponds to transmitted electron with high scattering angle. The azimuthal angle is the angle between the electron direction and the X axis, that is, the electron direction projected on the sample plane and the X axis. The azimuthal angle ranges from 0 to 360 degrees. For example, detector 250 is positioned in the X-Y plane downstream of sample 60. The azimuthal angle of direction 221 is angle 240 between X axis and its projected direction 241 in the X-Y plane. First detector 250 has an outer perimeter 251 that allows the detector to detect transmitted charged particles with the maximum exit angle 230.

Responsive to the irradiation of electron beam 111, a part (i.e. the first portion) of the transmitted charged particles, such as transmitted charged particles indicated by arrows 264 and 265, impinge the one or more detection segments of first detector 250 and are acquired by the first detector. A part (i.e. the second portion) of the transmitted charged particles, such as transmitted charged particles indicated by arrows 261, 262 and 263, pass through the first detector via one or more openings of the first detector, and are detected by a second detector 270 positioned downstream of the first detector. In some embodiment, the second detector 270 may not be centered along the primary axis, as shown in FIG. 2. For example, the second detector 270 is an EELS detector within a spectroscopic apparatus, and the entrance of the spectroscopic apparatus is aligned relative to the primary axis.

Figure 3D:
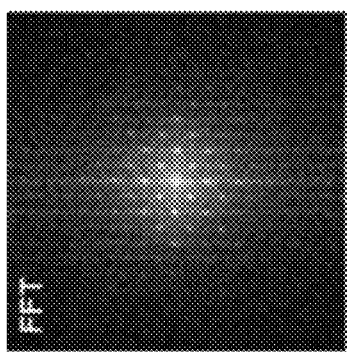
FIG. 3D is the Fourier transform of FIG. 3C.
Figure 3C:
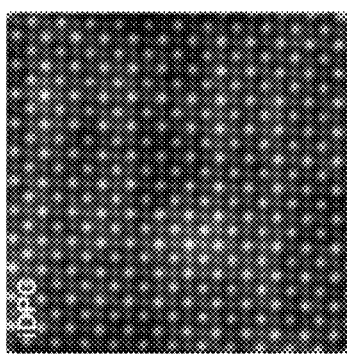
FIG. 3C is the integrated differential phase contrast (iDPC-STEM) image acquired with the detector of FIG. 3A.
Figure 3B:
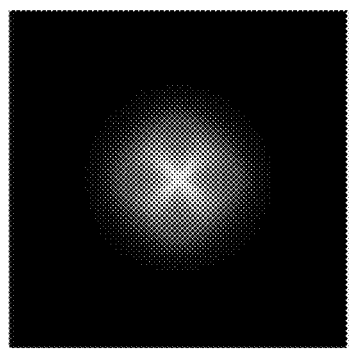
FIG. 3B is the contrast transfer function (CTF) using the detector of FIG. 3A.
Figure 3A:
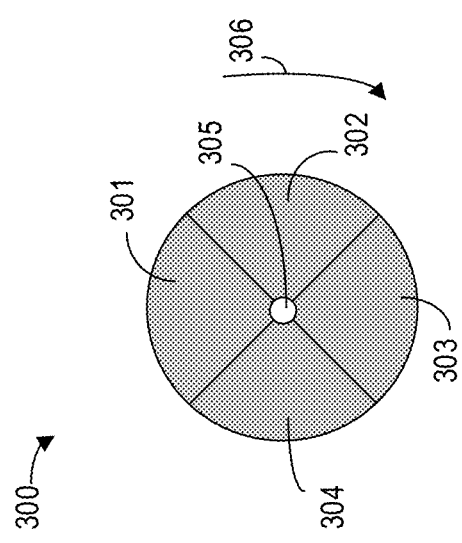
FIG. 3A shows an example detector with four connected detection segments for imaging sample structure.

FIG. 3A shows the top view of the conventional DPC/iDPC detector 300. Detector 300 includes four identical detection segments 301, 302, 303 and 304 arranged around the center (or geometric center) of detector 300. Each of the detection segment is in direct connection with two other detection segments. The detection segments cover 360 degrees in the azimuthal direction 306. Detector 300 may optionally have a round opening 305 at the center to allow electrons with low exit angle passing through the detector. The radius of the round opening may be less than one fifth of the radius of the detector's outer perimeter. Detector 300 captures all transmitted electrons with exit angle in the range [A1 A2], wherein A1≥0 degree and A2<90 degrees.

Figure 4D:
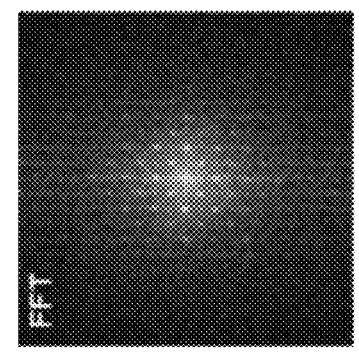
FIG. 4D is the Fourier transform of FIG. 4C.
Figure 4C:
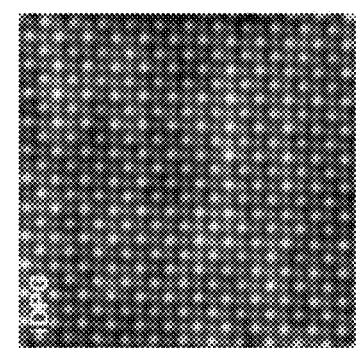
FIG. 4C is the iDPC-STEM image acquired with the detector of FIG. 4A.
Figure 4B:
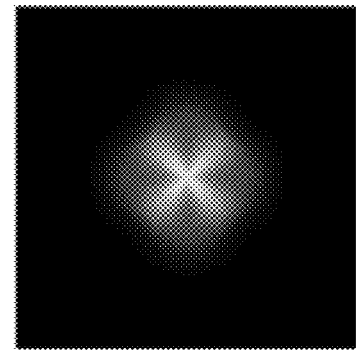
FIG. 4B is the CTF using the detector of FIG. 4A.
Figure 4A:
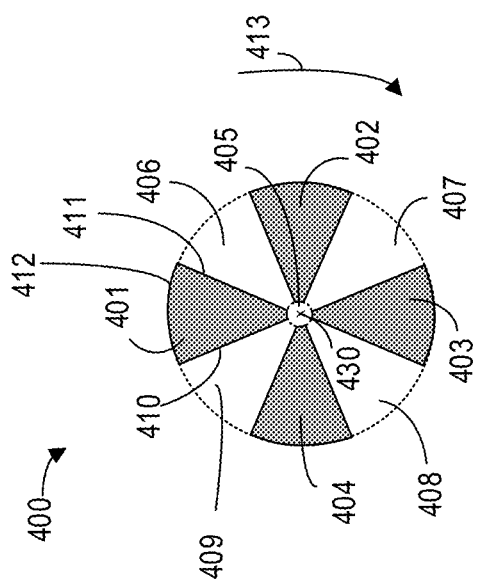
FIG. 4A shows an example detector with four separated detection segments for imaging sample structure.

FIG. 4A shows the top view of DPC/iDPC detector 400 according to current invention. Detector 400 includes four identical detection segments 401, 402, 403 and 404 evenly spread around the center (or geometric center) 430 of detector 300. The detection segments are separated from each other in the azimuthal direction 413 by an opening. For example, detection segments 401 and 402 are separated by opening 406. Each detection segment has two edges (such as edges 410 and 411) extending in the radial direction, and one edge (such as edge 412) arranged along the outer perimeter (dashed line) of the detector. Detector 400 has a round opening 405 at the center. The round opening 405 is in connection with each of the openings 406, 407, 408 and 409. The openings 406, 407, 408, and 409 are arranged around the center 430. Detector 400 detects half of the transmitted electrons with exit angle in the range [A3 A4], wherein A3 is greater than 0 degree and is determined by the diameter of the round opening. In one example, A3≤0.2·A4. Assuming the radius of the round opening is r1, and the radius of the outer perimeter is r2, at any radius between r1 and r2, the azimuthal angle covered by detector 400 is less than 360 degrees. Detector 400 and the downstream EELS detector (such as EELS detector 36 of FIG. 1) can simultaneously detect transmitted electrons with overlapping exit angles but non-overlapping azimuthal angles. For example, detector 36 can detect transmitted electrons with exit angle in the range of [0 A4].

In one example, the shape of each opening may be the same as each detection segment. Each detection segment and each opening cover 360/8 degrees in the azimuthal direction relative to the detector center. The total azimuthal angle range occupied by the detection segments is 180 degrees, which is the same as the total azimuthal angle range of occupied by the openings. This allows at least half of the transmitted electrons with high exit angle (such as exit angle greater than A3) to pass through detector 400 and be detected by the second detector. In another example, the area of each detection segments may be different from each of the openings between the detection segments. In other words, the total azimuthal angle range covered by the detection segments may be greater or less than the total azimuthal angle range covered by the openings.

Performance of detector 300 and detector 400 are compared in FIGS. 3A-3D and FIGS. 4A-4D. The same SrTiO$_3$ sample is imaged with both detectors. The detectors have the same outer perimeter and central openings (openings 305 and 405). The total detection area of detector 400 is half of the detection area of detector 300. FIGS. 3B and 4B are CTFs of detector 300 and detector 400, respectively. FIGS. 3C and 4C are iDPC-STEM images acquired by detector 300 and detector 400, respectively. FIGS. 3D and 4D are FFT of FIGS. 3C and 4C, respectively. Even with decreased total detection area, the CTF of detector 400 is similar to the CTF of detector 300. There is no significant change in the iDPC-STEM image or the resolution of iDPC-STEM image.

Figure 5A:
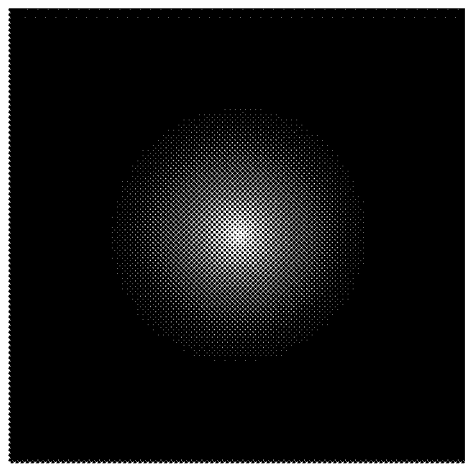
FIG. 5A shows an ideal CTF using a camera.
Figure 5B:
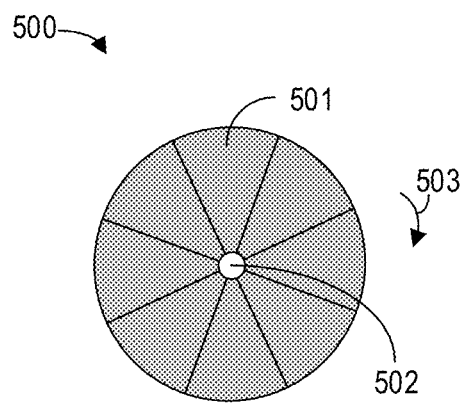
FIGS. 5B and 5C show an example detector with eight connected detection segments and its corresponding CTF.
Figure 5C:
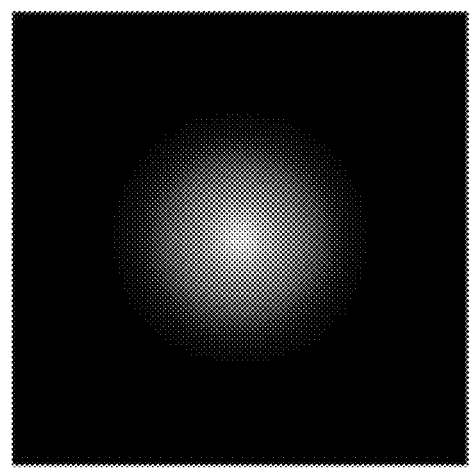

FIGS. 5B-5E show detectors with eight detection segments and their corresponding CTFs. FIG. 5B is the top view of conventional detector 500. Detector 500 has eight identical detection segments (such as detection segment 501) arranged similarly to detector 300. The detection segments are spread around the center of the detector. There is no opening between detection segments in the azimuthal direction 503 relative to the center of the detector. The detection segments cover the whole 360 degrees of azimuthal angle. A central opening 502 is arranged at the center of detector 500. FIG. 5C shows the CTF of detector 500.

Figure 5D:
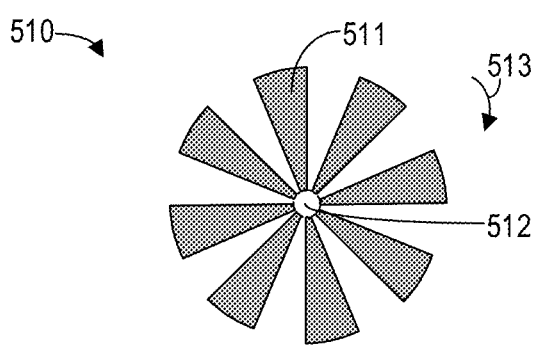
FIGS. 5D and 5E show an example detector with eight separated detection segments and its corresponding CTF.
Figure 5E:
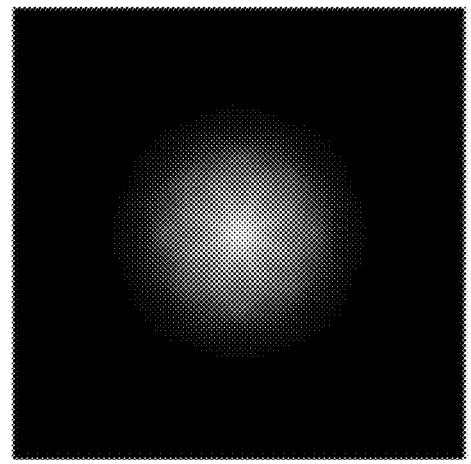
Figure 6A:
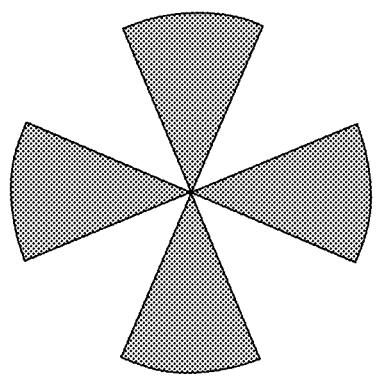
FIGS. 6A and 6B show example detectors with four and eight detection segments separated by disconnected openings.
Figure 6B:
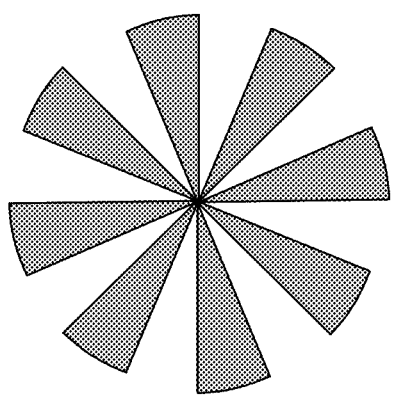

FIG. 5D shows detector 510 according to the current invention. Each detection segment and each opening cover 360/16 degrees in the azimuthal direction relative to the detector center. The detection segments are separated from each other by an opening. Detector 510 has a round opening 512 at the center. FIGS. 5A, 5C and 5E show CTFs of an ideal detector, detector 500 and detector 510, respectively.

Comparing to detectors 300 and 400, which have four detection segments, the detectors with eight segments have a CTF that is more similar to the ideal CTF of a camera in FIG. 5A. The camera may consist a large number of small segments called pixels, allowing to compute the center of mass (COM) or barycenter of illumination of the detector signal in order to form an ideal iDPC-STEM image called iCOM-STEM image (which is the CTF shown).

In some embodiments, the central opening may not be round. For example, the opening centered at the primary axis may be square, hexagon, or octagon. In some embodiments, the openings may be covered by electron transparent materials. In some embodiments, the number of detection segments may be any positive integer. In some embodiments, the detector with detection segments separated by openings may not have the windmill configuration. The detection segments and/or the openings may have different shapes within one detector. The detector may be manufactured using semiconductor device fabrication technologies.

FIGS. 6A and 6B show example detectors for simultaneous phase contrast and EELS imaging. The detectors in FIG. 6A and FIG. 6B have four and eight detection segments, respectively. Different from the detectors in FIG. 4A and FIG. 5D, the detection segments in FIGS. 6A and 6B are connected at the center of the detector. There is no opening at the center of the detector. In one example, each detection segment is identical to each opening. At any radius smaller than the radius of the outer perimeter, the total azimuthal angle covered by the detection segments is the same as the total azimuthal angle covered by the openings.

FIG. 7 shows method 700 for simultaneously acquiring structural and compositional information using microscope 100 of FIG. 1. The sample image showing sample structure is acquired by scanning a focused electron beam at multiple scan locations within a ROI. At each scan location, two spectra are acquired before and after adjusting the projection lens positioned between the sample and the first detector (such as the DPC/iDPC detector).

At 702, the microscope is prepared for imaging. After loading the sample into the imaging chamber, a low-resolution over-view image may be acquired to determine the ROI. Various system parameters, such as the electron beam parameters, scan parameters, and display parameters are also set.

At 704, the charged particle beam is focused onto a scan location determined at 702. At 706, responsive to the irradiation, transmitted charged particles exiting from the sample backside are simultaneously detected by the first detector (that is, the DPC/iDPC detector) and the second detector (that is, the EELS detector) downstream of the first detector. The first portion of the transmitted charged particles is detected by the first detector as the first signal, and the second portion of the transmitted charged particles is detected by the second detector as the first spectrum. The exit angles of transmitted charged particles detected by the first detector overlap with the exit angles of transmitted charged particles detected by the second detector. In one example, the first portion of transmitted charged particles have exit angles within the first range. The second portion of transmitted charged particles have exit angles within the second range. The first range and the second range overlap with each other.

At 708, the projection lens (such as projection lens 24 of FIG. 1) between the sample and the first detector is adjusted to rotate the transmitted charged particle beam azimuthally relative to the primary axis. After rotating the transmitted charged particle beam, at least a part of the charged particles detected by the first detector at 706 can pass through the first detector and be detected by the second detector. Similarly, at least a part of charged particles passed through the first detector at 706 can be detected by the first detector. The rotation angle depends on the configuration of the first detector. For example, for detectors with the "windmill" configuration, the rotation angle depends on the number of detection segments. For the detector with four detection segments, the rotation angle may be 45 degrees.

At 710, the first detector detects the second signal and the second detector detects the second spectrum. The first signal and the second signal correspond to transmitted electrons with different azimuthal angles. Similarly, the first and second spectra correspond to transmitted electrons with different azimuthal angles. By rotating the transmitted electron beam, the transmitted electrons exiting from a solid angle from the sample may be sensed by the second detector. The solid angle has an apex at the scan location and is symmetric relative to the primary axis.

At 712, method 700 checks whether all scan locations have been imaged. If the answer is NO, method 700 directs the charged particle beam to the next scan location at 714 and continues the data acquisition. Otherwise, method 700 stops the scan and moves to 716.

At 716, for each scan location, the first spectrum and the second spectrum are combined to generate a combined spectrum of the scan location. Sample composition is analyzed based on the combined spectra. Each combined spectrum includes transmitted electrons with a large range of exit angles. The amount of transmitted electrons forming the combined spectrum is effectively the same as the amount of transmitted electrons collected by the spectroscopic apparatus without the DPC/iDPC detector. As a result, chemical analysis based on the combined spectrum can be reliably performed.

At 718, the sample image is generated. The sample image representing sample structure may be generated based on the first signal and/or the second signal received by the first detector at each scan location. The sample image may be a phase contrast image such as the DPC-STEM or iDPC-STEM image. Further, the sample image may be displayed together with the compositional information extracted from the combined spectra at 716. Due to simultaneous signal detection for DPC-STEM/iDPC-STEM and EELS, the structural and compositional information are spatially registered.

FIG. 8 shows another method 800 for simultaneously acquiring sample's structural and compositional information using microscope 100 of FIG. 1. The same amount of data is acquired as method 700. However, different from method 700, herein, the ROI is scanned twice. Further, the projection lens is adjusted between the two scans instead of during one scan. By adjusting the projection lens between the ROI scans, the total data acquisition time may be reduced. The sample shift between the two scans is corrected based on the sample image acquired using the first detector.

At 802, similar to step 702 of method 700, the microscope is prepared for imaging.

The ROI is selected, and the system parameters are set.

At 804, similar to step 704 of method 700, the focused charged particle beam is directed to a scan location of the ROI. Responsive to the irradiation, the first signal is acquired with the first detector (such as the DPC/iDPC detector) and the first spectrum is acquired with the second detector (such as the EELS detector). At 808, method 800 checks whether all scan locations have been imaged for the first scan. If the answer is NO, the charged particle beam is directed to the next scan location at 810. Otherwise, the first scan is completed, and method 800 moves to 812.

At 812, similar to step 708 of method 700, the projection lens positioned between the sample and the first detector is adjusted in order to rotate the transmitted charged particle beam relative to the first detector. The second scan is performed with the adjusted projection lens.

At 814, the charged particle beam is directed to the initial scan location within the ROI to start the second scan. At 816, the second signal is acquired with the first detector, and the second spectrum is acquired with the second detector. At 818, method 800 checks whether all scan locations have been imaged. If the answer is NO, the charged particle beam is directed to the next scan location at 820. Otherwise, the second scan is completed, and method 800 moves to 822.

At 822, the sample images are formed. A first sample image may be formed by processing the first signals acquired with the first detector during the first scan. A second sample image may be formed by processing the second signals acquired with the first detector during the second scan. The first and second sample images may be DPC-STEM or iDPC-STEM images. In some examples, a combined sample image may be generated based on the first and second signals.

At 824, at each scan location, the acquired first spectrum and the second spectrum are combined to generate a combined spectrum of the scan location. In order to correct sample shift between the first and second scans, the first and second spectra may be combined based on the first and second sample images. In one example, the sample shift is determined by comparing the first and second sample images. The first and second spectra corresponding to the same scan location of the sample are then combined (such as added) to generate the combined spectrum of the scan location. Compositional information may be extracted by analyzing the combined spectra. The sample image may be displayed together with the compositional information as a single image.

In some embodiments, instead of adjusting the projection lens as shown in FIGS. 7-8, the sample or the first detector may be rotated.

FIG. 9 shows another method 900 for simultaneously acquiring sample's structural and compositional information using microscope 100 of FIG. 1. Different from method 700 and method 800 of FIGS. 7-8, method 900 does not rotate the transmitted charged particles entering the spectrometer. Each of the first detector and the second detector acquires transmitted electrons of a portion of the solid angle at the sample backside. Quality of the EELS spectra is lower than the combined spectra formed in methods 700 and 800. However, since the EELS spectra acquired in method 900 include electrons with high scattering angles, chemical composition analysis may still be reliably performed on the EELS spectra acquired by the second detector.

At 902, similar to step 702 of method 700, the microscope is prepared for imaging. The ROI is selected, and the system parameters are set.

At 904, similar to step 704 of method 700, the focused charged particle beam is directed to a scan location of the ROI. Responsive to the irradiation, the signal is acquired with the first detector (such as the DPC/iDPC detector) and the spectrum is acquired with the second detector (such as the EELS detector). At 908, method 900 checks whether all scan locations have been imaged. If the answer is NO, the charged particle beam is directed to the next scan location at 910. Otherwise, the scan is completed, and method 900 moves to 912.

At 912, the sample image is generated with signals detected from the first detector. The sample image may be DPC-STEM or iDPC-STEM image. The spectra acquired with the second detector are analyzed to extract compositional information. The structural and compositional information may be stored or displayed together in a combined phase contrast and EELS image at 914.

The technical effect of detecting transmitted electrons simultaneously with the first and second detectors is that the structural and compositional information at a sample location can be acquired. Further, the compositional information may be aligned/processed based on the structural information. The technical effect of using a first and second detector for detecting transmitted charged particles with overlapped exit angles is that high-scattering-angle electrons can be detected for EELS analysis. The technical effect of rotating the transmitted electrons relative to the first detector is that a combined spectrum corresponding to transmitted electrons with large azimuthal angle coverage can be obtained. The technical effect of using the windmill type detector for iDPC-STEM imaging is that the image quality is satisfactory even with reduced detection area comparing to the conventional DPC/iDPC detector. Further, high-scattering-angle electrons can pass through the openings between the detection segments and enter the downstream EELS apparatus.

In one embodiment, a method for imaging the sample with charged particles includes directing the charged particles towards the sample along a primary axis; and simultaneously detecting a first portion and a second portion of the charged particles transmitted through the sample with a first detector centered at the primary axis and a second detector positioned downstream of the first detector, respectively, wherein each of the transmitted charged particles exits the sample at an exit angle between the direction of the transmitted charged particle and the primary axis, and the exit angles of the first portion of the transmitted charged particles overlap with the exit angles of the second portion of the transmitted charged particles. In a first example of the method, the method further includes wherein the first detector includes one or more regions transparent to the charged particles, allowing the second portion of the charged particles to pass through the first detector and be detected by the second detector. A second example of the method optionally includes the first example and further includes wherein the first detector includes a charged particle transparent region extending less than 360 degrees in an azimuthal direction relative to the primary axis along a radius of the first detector. A third example of the method optionally includes one or more of the first to the second examples, and further includes wherein the direction of the transmitted electrons are further defined by an azimuthal angle in a plane perpendicular to the primary axis, and the first detector and the second detector detect the transmitted charged particles with the same exit angles but different azimuthal angles. A fourth example of the method optionally includes one or more of the first to the third examples, and further includes, wherein the exit angles of the first portion of the transmitted charged particles are within a first range, and the exit angles of the second portion of the transmitted charged particles are within a second range, and the first range overlaps with the second range. A fifth example of the method optionally includes one or more of the first to the fourth examples, and further includes, wherein a maximum exit angle of the second range is not less than one fifth of a maximum exit angle of the first range. A sixth example of the method optionally includes one or more of the first to the fifth examples, and further includes, wherein the second portion of the transmitted charged particles is dispersed based on particle energy between the first detector and the second detector, and the method further comprising forming a first spectrum based on the second portion of the transmitted charged particles detected by the second detector. A seventh example of the method optionally includes one or more of the first to the sixth examples, and further includes, scanning a region of interest of the sample with the charged particles and forming a sample image representing sample structure based on the transmitted charged particles detected by the first detector. A eighth example of the method optionally includes one or more of the first to the seventh examples, and further includes, after simultaneously detecting the first portion and the second portion of transmitted charged particles, rotating the transmitted charged particles with respect to the first detector in an azimuthal direction relative to the primary axis, and simultaneously detecting the second portion and the first portion of the transmitted charged particles with the first detector and the second detector, respectively; forming a second spectrum based on the first portion of transmitted charged particles detected by the second detector; generating a combined spectrum by combining the first spectrum and the second spectrum; and analyzing sample composition based on the combined spectrum. A ninth example of the method optionally includes one or more of the first to the eighth examples, and further includes, wherein the first spectrum and the second spectrum are combined based on the transmitted charged particles detected by the first detector.

In one embodiment, a charged particle imaging system includes a source for generating charged particles; an illuminator for directing the charged particles towards a sample along a primary axis; a first detector positioned downstream of the sample and centered at the primary axis; a second detector positioned downstream of the first detector; and a controller with non-transitory instructions, and by executing the instructions, the controller is configured to: responsive to irradiating a location of the sample with the charged particles, simultaneously detect a first portion and a second portion of the charged particles transmitted through the sample with the first detector and the second detector, respectively, wherein each of the transmitted charged particles exits the sample at an exit angle between a direction of the transmitted charged particle and the primary axis, the exit angles of the first portion of the transmitted charged particles overlap with the exit angles of the second portion of the transmitted charged particles. In a first example of the system, the first detector includes an region transparent to the charged particles extending less than 360 degrees in an azimuthal direction relative to the primary axis along a radius of the first detector. A second example of the system optionally includes the first example and further includes wherein the first detector includes multiple detection segments, wherein at least two of the multiple detection segments are separated by the charged particle transparent region. A third example of the system optionally includes one or more of the first to the second examples, and further includes wherein each of the plurality of detection segments has two edges, and each of the two edges extending in a radial direction relative to the primary axis. A fourth example of the system optionally includes one or more of the first to the third examples, and further includes a spectrometer positioned between the first detector and the second detector for dispersing charged particles based on particle energy. A fifth example of the system optionally includes one or more of the first to the fourth examples, and further includes, wherein the controller is further configured to:

direct the charged particles to a plurality of locations of the sample; generate a sample image representing sample structure based on the transmitted charged particles detected by the first detector; and generate a spectrum at each of the plurality of locations based on the transmitted charged particles detected by the second detector. A sixth example of the system optionally includes one or more of the first to the fifth examples, and further includes a projection lens positioned between the sample and the first detector, and the controller is further configured to: adjust the projection lens to rotate the transmitted charged particles upstream of the first detector around the primary axis. A seventh example of the system optionally includes one or more of the first to the sixth examples, and further includes, wherein the controller is further configured to: direct the charged particles to a first location of the sample and acquire a first spectrum using the second detector; adjust the projection lens; acquire a second spectrum using the second detector with the adjusted projection lens; and generate a combined spectrum of the first location by combining the first spectrum and the second spectrum. A eighth example of the system optionally includes one or more of the first to the seventh examples, and further includes, wherein the controller is further configured to: scan a plurality of locations of the sample with the charged particles and acquire a first spectrum at each of the plurality of sample locations using the second detector; adjust the projection lens; scan the plurality of locations of the sample with the charged particles and acquire a second spectrum at each of the plurality of sample locations using the second detector with the adjusted projection lens; and at each of the plurality of sample locations, generate a combined spectrum by combining the first spectrum and the second spectrum. A ninth example of the system optionally includes one or more of the first to the eighth examples, and further includes, wherein the controller is further configured to: generate a first sample image based on transmitted charged particles detected by the first detector before adjusting the projection lens; and generate a second sample image based on transmitted charged particles detected by the first detector after adjusting the projection lens, and wherein combining the first spectrum and the second spectrum includes combining the first spectrum and the second spectrum based on the first sample image and the second sample image.

What is claimed is:

1. A method for imaging a sample with charged particles, comprising:
   directing the charged particles towards the sample along a primary axis; and
   simultaneously detecting a first portion and a second portion of the charged particles transmitted through the sample with a first detector centered at the primary axis and a second detector positioned downstream of the first detector, respectively, wherein each of the transmitted charged particles exits the sample at an exit angle between the direction of the transmitted charged particle and the primary axis, and the exit angles of the first portion of the transmitted charged particles overlap with the exit angles of the second portion of the transmitted charged particles.

2. The method of claim 1, wherein the first detector includes one or more regions transparent to the charged particles, allowing the second portion of the charged particles to pass through the first detector and be detected by the second detector.

3. The method of claim 2, wherein the first detector includes a charged particle transparent region extending less than 360 degrees in an azimuthal direction relative to the primary axis along a radius of the first detector.

4. The method of claim 1, wherein the direction of the transmitted electrons are further defined by an azimuthal angle in a plane perpendicular to the primary axis, and the first detector and the second detector detect the transmitted charged particles with the same exit angles but different azimuthal angles.

5. The method of claim 1, wherein the exit angles of the first portion of the transmitted charged particles are within a first range, and the exit angles of the second portion of the transmitted charged particles are within a second range, and the first range overlaps with the second range.

6. The method of claim 5, wherein a maximum exit angle of the second range is not less than one fifth of a maximum exit angle of the first range.

7. The method of claim 1, wherein the second portion of the transmitted charged particles is dispersed based on particle energy between the first detector and the second detector, and the method further comprising forming a first spectrum based on the second portion of the transmitted charged particles detected by the second detector.

8. The method of claim 7, further comprising scanning a region of interest of the sample with the charged particles and forming a sample image representing sample structure based on the transmitted charged particles detected by the first detector.

9. The method of claim 1, further comprising:
   after simultaneously detecting the first portion and the second portion of transmitted charged particles, rotating the transmitted charged particles with respect to the first detector in an azimuthal direction relative to the primary axis, and simultaneously detecting the second portion and the first portion of the transmitted charged particles with the first detector and the second detector, respectively;
   forming a second spectrum based on the first portion of transmitted charged particles detected by the second detector;
   generating a combined spectrum by combining the first spectrum and the second spectrum; and
   analyzing sample composition based on the combined spectrum.

10. The method of claim 9, wherein the first spectrum and the second spectrum are combined based on the transmitted charged particles detected by the first detector.

11. A charged particle imaging system, comprises:
   a source for generating charged particles;
   an illuminator for directing the charged particles towards a sample along a primary axis;
   a first detector positioned downstream of the sample and centered at the primary axis;
   a second detector positioned downstream of the first detector; and
   a controller with non-transitory instructions, and by executing the instructions, the controller is configured to:
   responsive to irradiating a location of the sample with the charged particles, simultaneously detect a first portion and a second portion of the charged particles transmitted through the sample with the first detector and the second detector, respectively, wherein each of the transmitted charged particles exits the sample at an exit angle between a direction of the transmitted charged particle and the primary axis, the exit angles of the first portion of the transmitted charged particles overlap with the exit angles of the second portion of the transmitted charged particles.

12. The charged particle imaging system of claim 11, wherein the first detector includes a region transparent to the charged particles extending less than 360 degrees in an azimuthal direction relative to the primary axis along a radius of the first detector.

13. The charged particle imaging system of claim 12, wherein the first detector includes multiple detection segments, wherein at least two of the multiple detection segments are separated by the charged particle transparent region.

14. The charged particle imaging system of claim 13, wherein each of the plurality of detection segments has two edges, and each of the two edges extending in a radial direction relative to the primary axis.

15. The charged particle imaging system of claim 11, further comprising a spectrometer positioned between the first detector and the second detector for dispersing charged particles based on particle energy.

16. The charged particle imaging system of claim 15, wherein the controller is further configured to:
   direct the charged particles to a plurality of locations of the sample;
   generate a sample image representing sample structure based on the transmitted charged particles detected by the first detector; and
   generate a spectrum at each of the plurality of locations based on the transmitted charged particles detected by the second detector.

17. The charged particle imaging system of claim 11, further comprising a projection lens positioned between the sample and the first detector, and the controller is further configured to: adjust the projection lens to rotate the transmitted charged particles upstream of the first detector around the primary axis.

18. The charged particle imaging system of claim 17, wherein the controller is further configured to:
   direct the charged particles to a first location of the sample and acquire a first spectrum using the second detector;
   adjust the projection lens; acquire a second spectrum using the second detector with the adjusted projection lens; and
   generate a combined spectrum of the first location by combining the first spectrum and the second spectrum.

19. The charged particle imaging system of claim 17, wherein the controller is further configured to:
   scan a plurality of locations of the sample with the charged particles and acquire a first spectrum at each of the plurality of sample locations using the second detector;
   adjust the projection lens;
   scan the plurality of locations of the sample with the charged particles and acquire a second spectrum at each of the plurality of sample locations using the second detector with the adjusted projection lens; and
   at each of the plurality of sample locations, generate a combined spectrum by combining the first spectrum and the second spectrum.

20. The charged particle imaging system of claim 19, wherein the controller is further configured to:
   generate a first sample image based on transmitted charged particles detected by the first detector before adjusting the projection lens; and
   generate a second sample image based on transmitted charged particles detected by the first detector after adjusting the projection lens, and wherein combining the first spectrum and the second spectrum includes combining the first spectrum and the second spectrum based on the first sample image and the second sample image.

* * * * *